(12) United States Patent
Rat et al.

(10) Patent No.: US 10,489,240 B2
(45) Date of Patent: Nov. 26, 2019

(54) EFFICIENT DETECTION OF CORRUPT DATA

(71) Applicant: Microsoft Technology Licensing, LLC, Redmond, WA (US)

(72) Inventors: Cornel Emilian Rat, Bothell, WA (US); William Tipton, Seattle, WA (US); Chesong Lee, Bellevue, WA (US); Rajsekhar Das, Kirkland, WA (US); Erik Hortsch, Bellevue, WA (US); Arushi Aggarwal, Seattle, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 154 days.

(21) Appl. No.: 14/986,333

(22) Filed: Dec. 31, 2015

(65) Prior Publication Data

US 2017/0091020 A1    Mar. 30, 2017

Related U.S. Application Data

(60) Provisional application No. 62/233,182, filed on Sep. 25, 2015.

(51) Int. Cl.
*G11C 29/00* (2006.01)
*G06F 11/10* (2006.01)
(Continued)

(52) U.S. Cl.
CPC ...... *G06F 11/1004* (2013.01); *G06F 11/1435* (2013.01); *G06F 16/11* (2019.01);
(Continued)

(58) Field of Classification Search
CPC .......... G06F 11/07; G06F 11/08; G06F 11/10; G06F 11/1004; G06F 11/1435;
(Continued)

(56) References Cited

U.S. PATENT DOCUMENTS 7,523,343 B2    4/2009    Leis et al.
7,774,320 B1    8/2010    Day et al.
(Continued)

FOREIGN PATENT DOCUMENTS

CN    104199888 A    12/2014
WO    2013039535 A1    3/2013

OTHER PUBLICATIONS

"International Search Report and Written Opinion Issued in PCT Application No. PCT/US2016/051193", dated Nov. 30, 2016, 14 Pages.
(Continued)

*Primary Examiner* — Albert Decady
*Assistant Examiner* — Enamul M Kabir
(74) *Attorney, Agent, or Firm* — Newport IP, LLC; Jacob P. Rohwer

(57) ABSTRACT

A file system can allocate data of a storage system into data units, wherein a set of data units can be grouped into a storage region within a volume. A process of verifying validity of data within a storage region can include obtaining a first set of error-detecting codes from a subset of the data stored in a storage system, such as from a data unit of a file system object. Each of the first set of error-detecting codes can be associated with a corresponding data unit within the storage region. A second set of error-detecting codes can be generated based at least in part on the first set of error-detecting codes, and the second set of error-detecting codes can be associated with the storage region so that the second set of error-detecting codes can be used to verify the validity of the data within the storage region.

13 Claims, 5 Drawing Sheets

(51) Int. Cl.
*G06F 16/11* (2019.01)
*G06F 16/13* (2019.01)
*G06F 11/14* (2006.01)
*H03M 13/09* (2006.01)
*H03M 13/29* (2006.01)
*H03M 13/15* (2006.01)

(52) U.S. Cl.
CPC .......... *G06F 16/13* (2019.01); *H03M 13/093* (2013.01); *H03M 13/2906* (2013.01); *H03M 13/2942* (2013.01); *H03M 13/09* (2013.01); *H03M 13/1515* (2013.01)

(58) Field of Classification Search
CPC ................. G06F 17/30; G06F 17/3007; G06F 17/30091; G06F 3/06; H03M 13/09; H03M 13/093; H03M 13/1515; H03M 13/2906; H03M 13/2942; H04L 29/08
See application file for complete search history.

(56) References Cited

U.S. PATENT DOCUMENTS

| | | | |
|---|---|---|---|
| 7,873,878 B2 | 1/2011 | Belluomini et al. | |
| 8,719,520 B1 | 5/2014 | Piszczek et al. | |
| 8,977,896 B1 | 3/2015 | Thigpen et al. | |
| 9,021,296 B1 | 4/2015 | Kiselev et al. | |
| 9,996,413 B2* | 6/2018 | Dhuse | G06F 11/1004 |
| 2004/0098419 A1 | 5/2004 | Bantz et al. | |
| 2004/0123202 A1* | 6/2004 | Talagala | G06F 11/1076 |
| | | | 714/736 |
| 2004/0250167 A1* | 12/2004 | Sato | G06F 11/1433 |
| | | | 714/6.1 |
| 2008/0115017 A1* | 5/2008 | Jacobson | G06F 11/1076 |
| | | | 714/710 |
| 2008/0184091 A1* | 7/2008 | Chen | G11B 20/1833 |
| | | | 714/758 |
| 2008/0276152 A1* | 11/2008 | Hughes | G06F 11/1076 |
| | | | 714/770 |
| 2012/0080862 A1 | 4/2012 | Westnedge et al. | |
| 2013/0080862 A1 | 3/2013 | Bennett | |
| 2013/0179759 A1* | 7/2013 | Aronovich | G06F 11/1004 |
| | | | 714/807 |
| 2013/0246847 A1* | 9/2013 | Yu | G06F 11/08 |
| | | | 714/18 |
| 2014/0201155 A1 | 7/2014 | Vijayan et al. | |
| 2015/0186207 A1 | 7/2015 | Zhou | |
| 2015/0256204 A1* | 9/2015 | Torii | G06F 11/1068 |
| | | | 714/755 |
| 2015/0339187 A1* | 11/2015 | Sharon | G11C 29/52 |
| | | | 714/766 |
| 2016/0170832 A1* | 6/2016 | Armstrong | G06F 3/0619 |
| | | | 714/764 |

OTHER PUBLICATIONS

Bierman, et al., "How I Use the Advanced Capabilities of Btrfs", Published on: Aug. 2012 Available at: http://www.oracle.com/technetwork/articles/servers-storage-admin/advanced-btrfs-1734952.html.

Storage Windows Server 2012, In White Paper of Microsoft, Nov. 2, 2012, 44 pages.

Zhang, et al., "End-to-end Data Integrity for File Systems: A ZFS Case Study", In Proceedings of 8th USENIX Conference on File and Storage Technologies, Feb. 23, 2010, 14 pages.

Hoye, Didier Van, "REFS Is Going Places at Microsoft Ignite 2015", Published at: May 7, 2015 Available at: https://blog.workinghardinit.work/2015/05/07/refs-is-going-places-at-microsoft-ignite-2015/.

Li, et al., "Toward I/O-Efficient Protection against Silent Data Corruptions in RAID Arrays", In Proceedings of 30th Symposium on Mass Storage Systems and Technologies, Jun. 2, 2014, 12 pages.

Sun, et al., "Using Declarative Invariants for Protecting File-System Integrity", In Proceedings of 6th Workshop on Programming Languages and Operating Systems, Oct. 23, 2011, pp. 1-5.

Despe, Paul, "Troubleshooting Data Deduplication Corruptions", Published on: May 13, 2015 Available at: http://social.technet.microsoft.com/wiki/contents/articles/31038.troubleshooting-data-deduplication-corruptions.aspx.

Administration Guide—OnePass Agent for Windows File System, Retrieved on: Sep. 17, 2015 Available at: http://documentation.commvault.com/commvault/release_9_0_0/books_online_1/english_us/pdf/fs_archive_win_admin.pdf.

"Second Written Opinion Issued in PCT Application No. PCT/US2016/051193", dated Jul. 25, 2017, 7 Pages.

"International Preliminary Report on Patentability Issued in PCT Application No. PCT/US2016/051193", dated Nov. 6, 2017, 10 Pages.

* cited by examiner

EFFICIENT DETECTION OF CORRUPT DATA

CROSS REFERENCE TO RELATED APPLICATION

This patent application claims the benefit of U.S. Provisional Patent Application Ser. No. 62/233,182 filed Sep. 25, 2015, entitled "EFFICIENT DETECTION OF CORRUPT DATA", which is hereby incorporated in its entirety by reference.

BACKGROUND

In computing, a file system is configured to manage access to data stored in a storage system. In some instances, portions of the data can be corrupt or otherwise invalid. If these corruptions are not detected and repaired, the storage system is at risk of irreparable data loss. For example, moving corrupt pieces of data to different storage locations on resilient media can cause the corrupt data to be propagated throughout the storage system, with no way of repairing the corrupt data or otherwise recovering the valid data from different copies of the data.

Existing file systems offer some data integrity tools. However, in some scenarios where the presence of corrupt data in a storage system is to be detected, the use of these existing data integrity tools is computationally intensive and can reduce throughput of the system. Users of existing file systems must therefore choose between risking propagation of corrupt data or using a computationally intensive corruption-detection approach that is not scalable because computational overhead worsens as data storage capacity increases.

SUMMARY

Described herein are techniques and systems for efficiently detecting corrupt data in a storage region using a set of error-detecting codes for the storage region that are based at least in part on data unit error-detecting codes of the data units within the storage region. In some configurations, a file system can allocate data of a storage system into data units, wherein a set of data units can be grouped into a storage region within a volume. A process of verifying validity of data within a storage region can include obtaining a first set of error-detecting codes from a subset of the data stored in a storage system, such as from a data unit of a file system object. Each error-detecting code in the first set of error-detecting codes can be associated with a corresponding data unit within the storage region. The process can continue by generating a second set of error-detecting codes based at least in part on the first set of error-detecting codes, and associating the second set of error-detecting codes with the storage region. Thus, the first set of error-detecting codes can be regarded as "data unit error-detecting codes" due to their association with individual data units, and the second set of error-detecting codes can be regarded as "container error-detecting codes" due to their association with an individual storage region (for illustrative purposes, the storage region is sometimes called a "container" herein). The process can then verify the validity of the data within the storage region based at least in part on the second set of error-detecting codes (i.e., the container error-detecting codes).

The techniques and systems described herein provide a file system with data integrity that is also scalable due to the efficient use of a set of container error-detecting codes that are computed across an entire storage region of the file system and stored at the container-level (e.g., in the container's metadata). The container error-detecting codes—being based at least in part on the data unit error-detecting codes associated with the underlying data units within the storage region—allow for implementation of a file system with improved throughput without adding significant cost in terms of storage footprint used to store the container error-detecting codes. Furthermore, because the described validation process for a storage region can avoid accessing and reading subsets of data (e.g., a file system objects, such as files themselves and/or file metadata) in order to re-compute the data unit error-detecting codes for validating data within the storage region, the techniques and systems described herein are likely to result in significant improvements in performance. Additionally, the set of container error-detecting codes can be updated in a computationally efficient manner in response to incremental changes to the data within the storage region.

This Summary is provided to introduce a selection of concepts in a simplified form that is further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The detailed description is described with reference to the accompanying figures. In the figures, the left-most digit(s) of a reference number identifies the figure in which the reference number first appears. The same reference numbers in different figures indicates similar or identical items.

DETAILED DESCRIPTION

Figure 1:
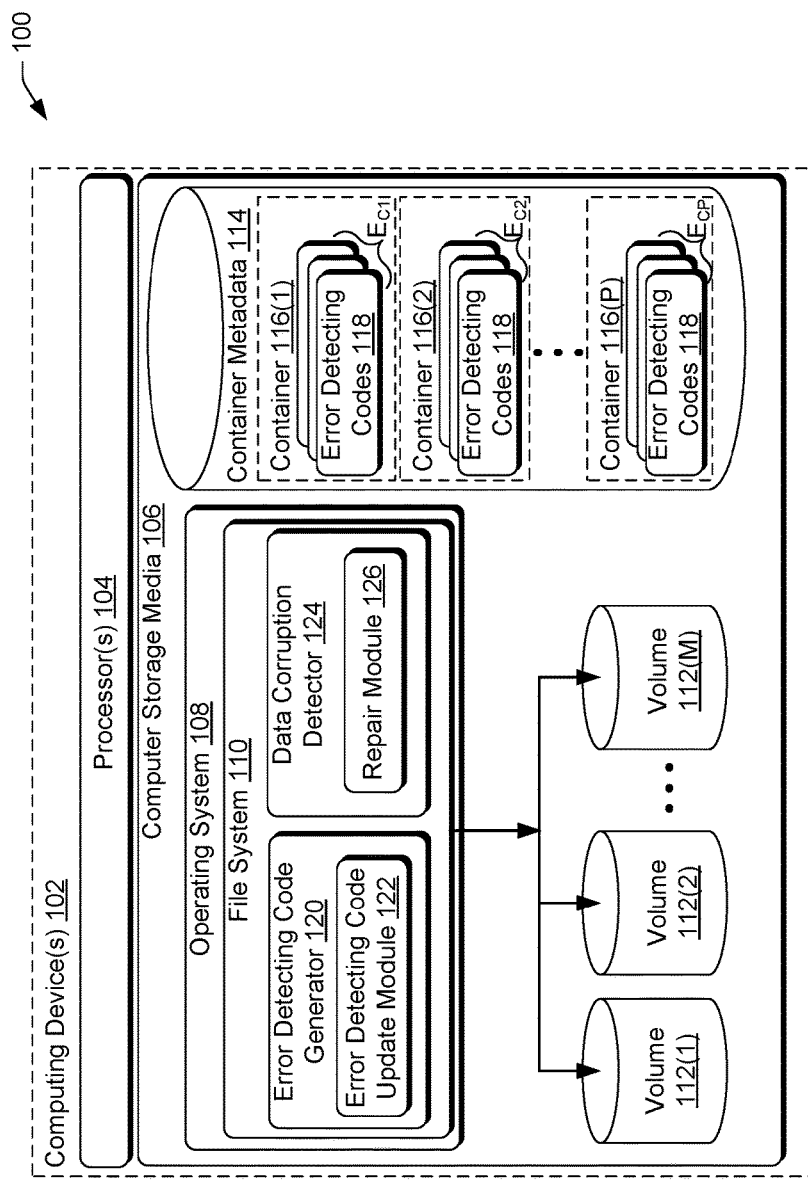
FIG. 1 illustrates an example computer system configured to perform an efficient data corruption detection process.

Configurations of the present disclosure are directed to, among other things, techniques and systems for efficiently detecting corrupt data in a storage region (referred to herein, for illustrative purposes, as a "container") using a set of container error-detecting codes that are based at least in part on data unit error-detecting codes of the data units within the storage region. Although many of the examples presented herein are described in terms of a file system that manages access to data stored within a storage system, the configurations disclosed herein can be implemented in a number of ways and in varying applications. Particularly, the techniques and systems described herein can be applied to any type of data set that includes data units and groupings of data units into sets of data units. Furthermore, although many examples describe determining data corruption in the context of moving data between storage locations, it is to be appreciated that the techniques and systems described herein can be used in other contexts, such as any data replication context that does not involve moving data between storage locations. For example, a process of verifying validity of data within a container can be performed in response to an instruction to check for corrupt data within the container (e.g., a general "health" monitoring process), without moving the container to a different storage location.

By the use of the techniques disclosed herein, one or more devices can be configured to conserve resources with respect to power resources, memory resources, communications bandwidth resources, processing resources, and/or other resources while providing mechanisms for detecting the presence of corrupt data within a storage system. Furthermore, the efficient corruption detection techniques described herein can be implemented in data transfer operations to avoid propagations of corrupt data throughout a storage system, thereby making data transfer (or movement) operations more secure and reliable. Technical effects other than those mentioned herein can also be realized from an implementation of the technologies disclosed herein.

As noted above, many of the examples presented herein are described in terms of a file system that manages access to data stored within a storage system. Before reference is made to the figures, some introductory context on file system organization is provided. In order to manage access to stored data, a file system generally allocates available storage space in a granular manner such that the data can be partitioned into data units, which in some systems include "blocks" or "clusters," where a data unit can be the smallest-size portion of the data that is tracked by the file system. The data units can be grouped into larger storage regions (or "containers") of data at various sizes in accordance with a hierarchical arrangement. For example, data can be stored on a volume of a particular size (e.g., a one terabyte (TB) volume), and the volume can include multiple containers of a smaller size (e.g., multiple 64 megabyte (MB) containers), and each container can include multiple data units of an even smaller size (e.g., multiple 4 kilobyte (kB) blocks of data).

Additionally, file systems can comprise at least two types of data: user data, and file system metadata. Furthermore, this data can be organized into a hierarchical organization of one or more directories. User data can include, without limitation, text data, image data, audio data (e.g., music), video data, multimedia data, and the like. File system metadata can comprise any type of data that is not user data, and can include, without limitation, data that informs a processing system of statistics and structure of files containing user data, access control information (e.g., access control lists specifying which users, system processes, and/or operations are allowed to access files), or data that is not associated with any particular file, such as information about unused storage regions, and so on. The file system metadata can include metadata associated with an individual file, referred to herein as "file metadata." Such file metadata can include any information that describes the individual file, such as, without limitation, error detection information, a length or size of the data contained in the file, a time that the file was created, as well as times that the file is modified, accessed, backed up, moved, or otherwise used, one or more identifiers associated with the file, access permissions associated with the file, how the file is formatted, the type of content stored in the file, or other attributes of the file (e.g., whether the file is read-only, read/write, executable, etc.), and so on. Moreover, the file system can manage various "file system objects." File system objects, as used herein, can include any file system entity that can be viewed as an object, regardless of whether or not the file system itself interacts with the file system entity in an object-oriented fashion. As such, a file system object can include, without limitation, files, directory objects (e.g., a root directory object (i.e., a top-level position within a directory from which subdirectories extend), subdirectory objects, directory table objects, wherein a directory table stores multiple directory entries having attributes for individual files, etc.), file system metadata, and/or any combination thereof. A file can also be partitioned and stored as multiple data units so that the file can be stored in a fragmented manner across multiple storage devices. Accordingly, a given set of data units within a container can represent all or part of a single file or multiple files, or any file system object (e.g., file metadata or the like).

The techniques and systems described herein can be implemented in a number of ways. Example implementations are provided below with reference to the following figures.

FIG. 1 illustrates an example computer system 100 configured to perform an efficient data corruption detection process according to the configurations disclosed herein. For example, the computer system 100 can include one or more computing devices 102 (or computing machines), including, without limitation, one or more servers, one or more data center systems, one or more personal computers, or any other suitable computing device(s). The computer system 100 is merely one example system to implement the techniques described herein such that the techniques described herein are not limited to performance using the computer system 100 of FIG. 1.

The computing device(s) 102 can include one or more processors 104, which can represent any suitable type of execution unit, such as a central processing unit (CPU), a core, and/or a node, depending on the implementation details of the computing device(s) 102. For example, any individual processor 104 can represent a single CPU, a node having multiple processors or cores configured to execute separate threads, or any other suitable processor arrangement. In some configurations, the processor(s) 104 can include hardware processors that include, without limitation, a hardware central processing unit (CPU), a field programmable gate array (FPGA), a complex programmable logic device (CPLD), an application specific integrated circuit (ASIC), a system-on-chip (SoC), or a combination thereof.

The computing device(s) 102 can be equipped with one or more forms of computer-readable storage media 106. Computer-readable media can include two types of computer-readable media, namely computer storage media 106 and communication media. The computer storage media 106 can include volatile and non-volatile, removable, and non-removable media implemented in any method or technology for storage of information, such as computer readable instructions, data structures, program modules, or other data. The computer storage media 106 includes, but is not limited to, random access memory (RAM), read-only memory (ROM), erasable programmable read-only memory (EEPROM), flash memory or other memory technology, compact disc read-only memory (CD-ROM), DVD, or other optical storage, magnetic cassettes, magnetic tape, magnetic disk storage or other magnetic storage devices, or any other non-transmission medium that can be used to store the desired information and which can be accessed by the computing device(s) 102. Any such computer storage media can be part of the computing device(s) 102.

In contrast, communication media embody computer-readable instructions, data structures, program modules, or other data in a modulated data signal, such as a carrier wave, or other transmission mechanism. As defined herein, computer storage media does not include communication media.

In some configurations, the computer storage media 106 can store programming instructions, data structures, program modules and other data, which, when executed by one or more of the processors 104, implement some or all of the processes described herein. Moreover, all or parts of the computer storage media 106 can be physically centralized relative to the computing device(s) 102, or at least portions of the computer storage media 106 can be physically distributed across multiple different storage devices. Furthermore, the computing device(s) 102 can represent a single computing device 102 or multiple computing devices 102 that can be physically distributed and communicatively coupled via communications interfaces (e.g., a network of computers). In some configurations, the computer system 100 represents all or part of a storage system for storing data and managing access to the stored data.

The computer storage media 106 can include an operating system 108 configured to, among other things, provide a file system 110 for managing access to data stored on one or more storage devices of the computer system 100. Accordingly, the computing device(s) 102 can represent, at least partly, a storage system architecture that is configured to service one or more volumes 112(1), 112(2), . . . , 112(M) (collectively 112). The volumes 112 can represent, or be associated with, any number of physical storage devices, such as a Redundant Array of Independent (or Inexpensive) Disks (RAID), one or more hard disk drives (HDDs), one or more solid state drives (SSDs), tiered storage systems, or any similar physical storage configuration. Furthermore, a volume 112 can be regarded as a type of "container" (or "storage region") as the term is used herein, wherein a "container" includes (or is associated with) multiple data units of smaller size than the size of the container. In one illustrative example, there can be a one-to-one correspondence between a volume and a container, such that a volume includes a single container of the same size as the volume. In some cases, a container, such as the volume 112, can itself include additional containers of data (i.e., a container within a container hierarchy) where the additional containers within the volume 112 are smaller in size than the size of the volume 112.

The operating system 108 can be Windows-based, Unix-based, Linux-based, or any other suitable operating system type. The file system 110 can be configured to logically organize data that is stored on the volumes 112. Each volume 112 can comprise an address space that is known to the file system 110 for logically organizing data stored on the volume 112. For example, the volume 112(1) can be specified as a range of locations from zero to one TB, but this size is exemplary, and an individual volume 112 can be larger or smaller, depending on the configuration. When data is written to the volume 112(1), for example, a physical location within the volume 112(1) can be specified for the data that is to be written, and the specified location can be known to the file system 110 for managing access to the stored data.

Although FIG. 1 shows the file system 110 as being implemented as part of the operating system 108, at least some of the functionality of the file system 110 described herein can be performed, at least in part, by one or more hardware logic components. For example, and without limitation, illustrative types of hardware logic components that can be used include FPGAs, ASICs, SOCs, CPLDs, and the like.

FIG. 1 shows that the computer storage media 106 can maintain container metadata 114 associated with a plurality of containers 116(1), 116(2), . . . , 116(P) (collectively 116) that are associated with the individual volumes 112. The container metadata 114 can include any information that describes the individual containers 116, such as, without limitation, error detection information (described in more detail below), a length or size of the data contained in the container 116, a time that the container was created, as well as times that the container 116 is modified, accessed, moved, backed up, or otherwise used, one or more identifiers associated with the container 116, access permissions associated with the container 116, how the container 116 is formatted, the type(s) of content stored in the container 116, or other attributes of the container 116 (e.g., whether the container 116 is read-only, read/write, executable, etc.), and so on. The terms "buffer," "region," "storage region," and "band" can be used interchangeably herein with the term "container" to refer to the containers 116. In an example, the volume 112(1) can include a first set of the containers 116, the volume 112(2) can include a second, different set of the containers 116, and so on. Accordingly, in some configurations, the containers 116 can be defined in terms of a size that is smaller than the size of a volume 112.

An individual container 116 can contain multiple data units of even smaller size that are tracked by the file system 110. In an illustrative example, the volume 112(1) can be 1 TB in size, and can include multiple containers 116 that are each 64 MB in size, and each container 116 can include multiple data units that are each 4 kB in size. It is to be appreciated that other sizes and hierarchical arrangements can be utilized herein without departing from the scope of the techniques and systems described herein.

In some configurations, the containers 116 act as an indirection layer between physical locations of the volumes 112 and file representations of the data tracked by the file system 110, and each container 116 can be specified by a particular location within a volume 112, where a location within the volume can be specified in terms of an offset and a size. Furthermore, the containers 116 can be substantially equivalent in size, or the containers 116 can vary in size, even within a single volume 112.

The container metadata 114 can include, in association with each container 116, error detection information, for example, a set of container error-detecting codes 118 and the like. In an embodiment, the container 116(1) is associated with a set of container error-detecting codes 118 called "$E_{C1}$", the container 116(2) is associated with a set of error-detecting codes 118 called "$E_{C2}$", and so on up to "$E_{CP}$" for a number of P containers 116. Moreover, an individual set of container error-detecting codes 118, such as $E_{C1}$, can include any number of N container error-detecting codes 118.

Figures 2A, 2B:
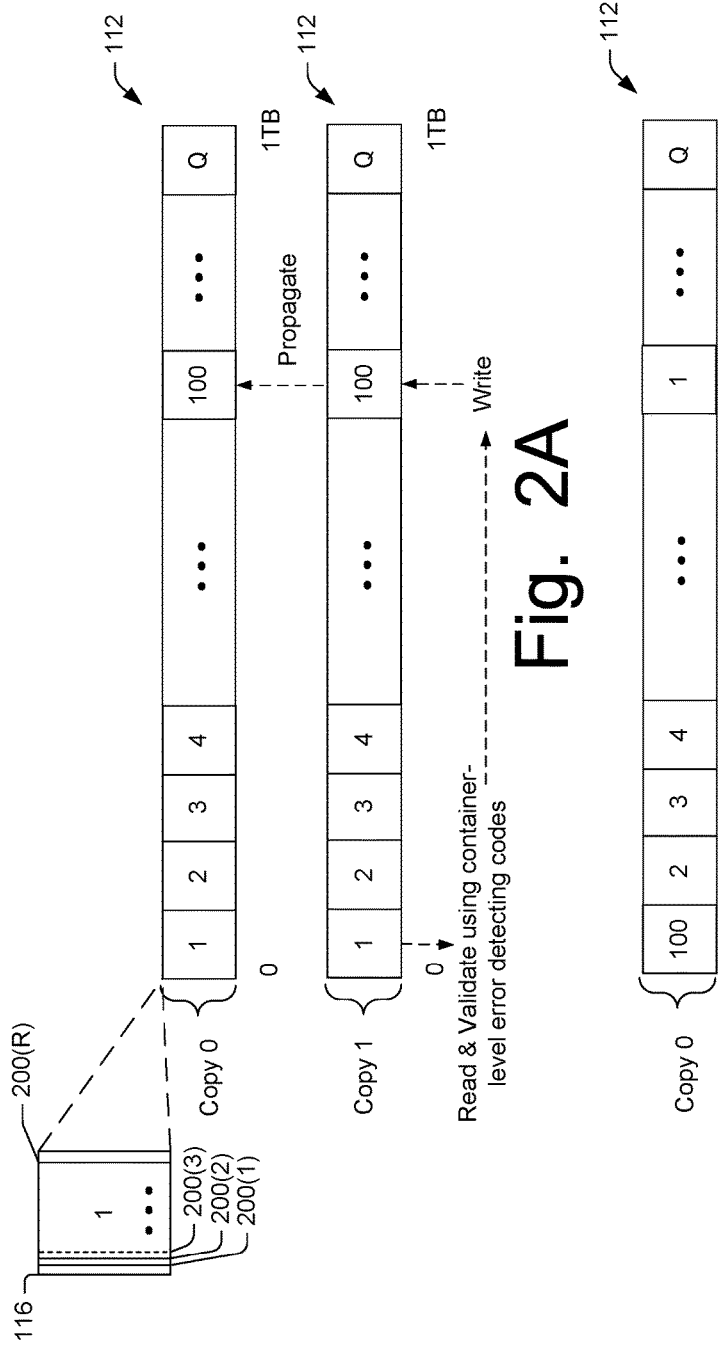
FIG. 2A is a diagram illustrating an example data movement operation involving efficient corruption detection.
FIG. 2B is a diagram illustrating an example data structure after data has been moved according to the diagram of FIG. 2A.

Furthermore, each set of container error-detecting codes 118 can be derived from the data unit error-detecting codes associated with the underlying data units within each container 116. Referring briefly to FIG. 2A, an example container 116 (labeled container "1") includes a plurality of data units 200(1), 200(2), 200(3), . . . , 200(R) (collectively 200), which can be referred to interchangeably herein as "blocks 200" or "clusters 200" of data, which represent a smallest size unit of data tracked by the file system 110. The file system 110 can also define a "file" as a subset of the data stored in the volumes 112, and each file can be broken down into a plurality of discrete data units 200. The file system 110 can provide an indirection layer through which other applications can create, delete, modify, and read the files, without the need for the application to have information about the actual storage locations of the files.

The file system 110 can allow for enabling integrity of the data (e.g., file system objects) it tracks using error detection information in file system metadata, for example by computing an error-detecting code (e.g., a check value, such as a checksum, cyclic redundancy check (CRC) value, etc.) for each data unit 200 (e.g., each 4 kB block of data) that makes up a file, and storing the corresponding data unit error-detecting codes in metadata associated with each file. In one embodiment, in order to distinguish container error-detecting codes ($E_C$) from data unit error-detecting codes, the data unit error-detecting codes associated with each data unit 200 can be referred to as "C" (to denote that the data unit error-detecting code is a check value (C) of a corresponding data unit 200 in the container 116). Thus, a given file can include entries that describe a physical location within a volume 112 where a data unit 200 that constitutes part of that file is stored, and the file's metadata can be used to understand a data unit error-detecting code, C, for that data unit 200.

Although there may be numerous ways in which the metadata of a file can be utilized, in an illustrative example, the metadata of a file can include the data unit error-detecting code, C, which allows for detection of corruption when a file is opened. That is, the file can be read, pushed into a buffer, and the data unit error-detecting code(s), C, for that file can be computed and compared to the stored data unit error-detecting codes, C, in the file's metadata. If the computed data unit error-detecting code, C, matches the stored data unit error-detecting code, C, the data in the file is considered valid. If the compared codes don't match, the data in the file is considered corrupt. In a redundant storage system where multiple copies of each data unit 200 are maintained separately, a corrupt data unit 200 can be repaired from a valid copy of the data unit 200.

Returning to FIG. 1, the file system 110 can utilize an error-detecting code generator 120 to generate the container error-detecting codes 118, $E_C$, for association with individual containers 116 tracked by the file system 110. The error-detecting code generator 120 can utilize any suitable technique for generating the container error-detecting codes 118, $E_C$, so long as the container error-detecting codes 118 are based at least in part on the data unit error-detecting codes, C, for the data units 200 within the containers 116. In some configurations, the error-detecting code generator 120 can store the data unit error-detecting codes, C, directly in the container metadata 114 without storing the data unit error-detecting codes, C, in the file metadata. In other words, the data unit error-detecting codes, C, can be decoupled from the file level and stored at the container level in association with the individual containers 116. Alternatively, the error-detecting code generator 120 can store the data unit error-detecting codes, C, in both of the container metadata 114 and the file metadata. For example, the error-detecting code generator 120 can copy the data unit error-detecting codes, C, from a subset of data (e.g., from the file metadata) and store the copied error-detecting codes, C, as container error-detecting codes 118, $E_C$, in the container metadata 114. In this scenario, the container metadata 114 maintains a one-to-one mapping of the data unit error-detecting codes, C, by maintaining the container error-detecting codes 118, $E_C$, at the container-level in the form of duplicated data unit error-detecting codes, C. This provides for improved throughput because the container error-detecting codes 118, $E_C$, can be accessed from the container metadata 114 without opening and reading the underlying files to retrieve the data unit error-detecting codes, C, from the file metadata.

In some configurations, the error-detecting code generator 120 can use encoding techniques to generate the container error-detecting codes 118, $E_C$. In some configurations, encoding techniques used to generate the container error-detecting codes 118 include applying a mathematical function to the data unit error-detecting codes, C, in order to generate the container error-detecting codes 118, $E_C$. For example, the error-detecting code generator 120 can utilize a Reed Solomon encoding technique to derive the container error-detecting codes 118, $E_C$, from the data unit error-detecting codes, C. For example, the "$E_{C1}$" set of container error-detecting codes 118 for the container 116(1) can include the set of container error-detecting codes 118 shown in the set of Equations (1), below:

$$\left.\begin{aligned} E_0 &= \sum_{i=0}^{count-1} P_0(i) * C_i \\ E_1 &= \sum_{i=0}^{count-1} P_1(i) * C_i \\ &\dots \\ E_{N-1} &= \sum_{i=0}^{count-1} P_{N-1}(i) * C_i \end{aligned}\right\} \quad (1)$$

In the set of Equations (1), the summation symbol represents a series of exclusive or (XOR, $\oplus$) operations. Further, the value $C_i$ represents the data unit error-detecting code, C, for the $i^{th}$ data unit in a container 116 having a plurality of data units. $P_0$ to $P_N$ represent respective polynomial functions that characterize the respective container error-detecting codes 118 in the "$E_{C1}$" set of error-detecting codes 118 represented by the set of Equations (1). Moreover, "N" in the set of Equations (1) can represent any number of container error-detecting codes, $E_C$, in a given set of container error-detecting codes 118. For example, N can equal 16 in order to generate 16 container error-detecting codes 118 for each set of container error-detecting codes 118, $E_C$, for a given container 116. N can be chosen to be larger or smaller than 16, where a larger value of N can provide for detecting a relatively higher number of corruptions and identifying a relatively larger number of data units 200 that are corrupt within a given container 116. However, the larger value of N comes at a greater memory cost to store the larger sets of container error-detecting codes 118 in the container metadata 114. Given N error-detecting codes in a set of container error-detecting codes 118, the system can detect at least N corruptions for a given container 116, and can identify up to N-1 data units 200 within the container 116 that are corrupt, if the number of corruptions in the container 116 is less than N.

In some configurations, the error-detecting code generator 120 can derive the container error-detecting codes 118, $E_C$, from the data unit error-detecting codes, C, by computing parities $Parity_0$, $Parity_1$, $Parity_{N-1}$. For example, for 0 is less than or equal to k, and for k is less than or equal to N, the following parities in Equation (2) can be computed based on the data unit error-detecting codes, C:

$$E_k(=Parity_k)=\Sigma_{i=0}^{count-1} m_i^k * C_i \quad (2)$$

Here, the summation again represents a series of XOR ($\oplus$) operations and all multiplications are field multiplications ($m_i^k$ and *), the $Parity_k$ values are stored in the container metadata 114 as the container error-detecting codes 118, $E_C$. In some configurations, a variation of such an encoding scheme can encode the data unit error-detecting codes, $C_1$, $C_2$, and $C_3$, for three example data units 200 within a container 116, as shown in Equations (3) and (4):

$$E_0 = C_1 \oplus C_2 \oplus C_3 \quad (3)$$

$$E_1 = (m_1 * C_1) \oplus (m_2 * C_2) \oplus (m_3 * C_3) \quad (4)$$

Here, the $E_0$ and $E_1$ values are stored in the container metadata 114 as the container error-detecting codes 118, $E_C$.

It is to be appreciated that the set of container error-detecting codes 118, $E_C$, regardless of the encoding scheme utilized, can comprise a smaller set of container error-detecting codes, $E_C$, which models the relatively larger set of data unit error-detecting codes, C, generated for the data units 200 within the container 116. That is, it can take less memory to store the set of container error-detecting codes 118, $E_C$, for a given container 116 than the memory it takes to store the data unit error-detecting codes, C, for the underlying data units 200 within the container 118. In this manner, the set of container error-detecting codes 118, $E_C$, can be a compressed form of the underlying data unit error-detecting codes, C, while the container error-detecting codes 118, $E_C$, still retain the characteristics of the data unit error-detecting codes, C, for detecting corruptions in the container's 116 data.

The set of container error-detecting codes 118, $E_C$, can also be processed in a more computationally-efficient manner as compared to processing the data unit error-detecting codes, C. This is at least due to the fact that the container error-detecting codes 118, $E_C$, can be utilized for detecting corruptions in data without having to open and read files, file metadata, or other subsets of data at the file level, to retrieve the data unit error-detecting codes, C. By contrast, if the system was constrained to using the data unit error-detecting codes, C, stored in the file metadata (i.e., if the container error-detecting codes 118 were unavailable), in order to determine whether data within a container 116 is valid, the system would have to scan an entire volume 112 by reading all of the files on a volume 112, and the files that reside within the container 116 would have to be identified and opened so that the data unit error-detecting codes, C, can be re-computed and compared to the stored data unit error-detecting codes, C. However, scanning an entire volume 112 (e.g., a one TB volume 112) can take days, and a single container 116 can contain a large number (e.g., tens of thousands) of files. Alternatively, instead of scanning the entire volume 112 to identify files associated with a given container 116, the system can store a reverse index mapping in a table that maps each data unit 200 to a given file. However, maintaining such a reverse index mapping is both computationally expensive and has a higher storage footprint than the techniques described herein. Therefore, validating data within a container 116 using the set of container error-detecting codes 118 in the container metadata 114 is computationally more efficient and can increase throughput of the system.

The error-detecting code generator 120 can include an error-detecting code update module 122 configured to update the individual sets of error-detecting codes 118 in response to a change in the underlying data within a container 116. For example, when a data unit 200 within the container 116(1) is changed in some way, the set of container error-detecting codes 118, $E_C$, are updated by the error-detecting code update module 122 so that the modified data is not mistaken in the future for a corrupt piece of data. In some configurations, the error-detecting code update module 122 can leverage efficiencies in updating the set of container error-detecting codes 118, $E_C$, in response to a change in the underlying data of a container 116. For example, instead of reading the entire contents of a container 116 to obtain all of the data unit error-detecting codes, C, and thereafter update all of the N container error-detecting codes 118, $E_C$, the error-detecting code update module 122 can identify the particular data unit 200 within the container 116 that has been changed, obtain the previous data unit error-detecting code ($C_{i\_old}$) for the identified data unit 200, generate/compute a new data unit error-detecting code ($C_{i\_new}$) from a subset of data (e.g., the file) associated with the data unit 200, and then perform a limited number of operations in order to update the container error-detecting codes 118, $E_C$, for the container 116. This, in turn, allows for updating the container error-detecting codes 118, $E_C$, without having to overwrite the entire set of N container error-detecting codes 118, $E_C$. For example, the $k^{th}$ container error-detecting code, $E_K$, among N container error-detecting codes in the "$E_{C1}$" set of error-detecting codes 118 can be updated as shown in Equation (5):

$$E_K = E_K \otimes (P_i * C_{i\_old}) \otimes (P_i * C_{i\_new}) \quad (5)$$

Equation (5) involves updating the $k^{th}$ container error-detecting code by subtracting the previous data unit error-detecting code, $C_{i\_old}$, and adding the new data unit error-detecting code, $C_{i\_new}$, to update the equation for the $k^{th}$ container error-detecting code 118, $E_K$. In contrast to re-computing the data unit error-detecting codes, C, for every data unit 200 within the container 116 and updating the container error-detecting codes 118, $E_C$, the described updating technique requires fewer operations and improves throughput of the system when updating the container error-detecting codes 118, $E_C$. Furthermore, the file system 110, at the time when a data unit 200 has changed and the container error-detecting codes 118 are to be updated in response to the change, already has access to the previous data unit error-detecting code ($C_{i\_old}$) so that the updating process implemented by the update module 122 can be performed without re-reading the file associated with the changed data unit 200 and re-computing the previous data unit error-detecting code ($C_{i\_old}$). Each container error-detecting code, $E_C$, in a set of N error-detecting codes 118 for a container 116 can be updated individually in this fashion by isolating the data unit 200 within the container 116 that has been changed, and updating the set of container error-detecting codes 118 in a highly efficient manner.

With the container error-detecting codes 118 generated, maintained, and updated in the container metadata 114, the file system 110 can utilize a data corruption detector 124 to detect corruptions in the data of any given container 116 without having to open subsets of data (e.g., files) associated with each data unit 200 in the container 116. That is, the data corruption detector 124 is configured to utilize the container error-detecting codes 118, $E_C$, in the container metadata 114 to determine whether data within the container 116 is valid or corrupt/invalid. There can be various reasons for using the data corruption detector 124 to check for corrupt data within a container 116. One example scenario can involve moving a container 116 to a new storage location within a volume 112. For example, the container 116(1) can be moved to a more easily accessible storage location within the volume 112(1) to improve speed of access to the data in the container 116(1). This movement instruction can stem from an automated system-initiated process, or from a user (e.g., administrator) instruction to move a container 116. In this example, the container 116(1) can be moved between tiered storage systems, such as moving the container 116(1) from a first storage tier (e.g., SSD) to a second storage tier (e.g., HDD). Some additional example reasons for moving containers 116 include achieving desired performance requirements, providing increased protection of the data in the container 116, and/or other considerations.

Referring again to FIG. 2A, two copies of a volume 112 are shown as "copy 0" and "copy 1". This can represent a storage system that provides redundancy, such as a storage system with a mirror configuration, or a parity configuration that provides multiple copies of the same data in different locations for fail-safe purposes. For example, if a system maintaining copy 0 of the volume 112 goes down or crashes, the availability of copy 1 of the volume 112 allows the system to recover the lost data. Accordingly, copy 0 of the volume 112 can contain a number of containers 116, labeled 1 to Q in FIG. 2A. The volume 112 can start at zero and end at an arbitrary size (e.g., one TB), and each container 116 (1-Q) in the volume 112 can be specified in terms of a containerized range and a physical range within the volume 112. For example, the container "1" in FIG. 2A can have a containerized range that starts at 1000 and has a length of 1000, and a physical range that starts at 0 and has a length of 1000. If the container "1" is to be moved to the storage location occupied by the container "100", and the container "100" is to be moved to the storage location occupied by the container "1" (i.e., if containers "1" and "100" are swapped), before the container "1" is moved to the new storage location, the data corruption detector 124 can attempt to read container "1" from copy 0. FIG. 2A shows that the container "1" includes a plurality of data units 200(1)-(R), where the data unit 200(3) is corrupt (as illustrated in FIG. 2A by the dashed line for the data unit 200(3)). The selection of which copy (i.e., copy 0 or copy 1) to read for moving the container "1" can be random or preconfigured. Regardless, the system does not know that the data in container "1" is corrupt prior to selecting copy 0 for the read operation.

Upon reading the container "1" from copy 0, the data corruption detector 124 can utilize the error-detecting code generator 120 to re-compute the set of container error-detecting codes 118, $E_C$, for the container "1". For example, if container "1" corresponds to the container 116(1) in FIG. 1, the "$E_{C1}$" set of error-detecting codes 118 can be generated for the container "1". The data corruption detector 124 can access the stored set of error-detecting codes 118, $E_{C1}$, in the container metadata 114 to compare the re-computed container error-detecting codes 118 to the stored container error-detecting codes 118 for $E_{C1}$. In this case, because of the corrupt data unit 200(3) in copy 0 of the container "1", the comparison results in a mismatch between the re-computed container error-detecting codes 118 and the stored container error-detecting codes 118 for $E_{C1}$, which indicates to the data corruption detector 124 that the container "1" from copy 0 contains corrupt data. Upon detecting the mismatch of the container error-detecting codes 118, the data corruption detector 124 can mark the container "1" as immovable so that the corrupt data unit 200(3) is not further propagated within the storage system. In this scenario, if a user attempts to open a file represented by a data unit, such as the data unit 200(3), within the container "1", the system can attempt to read the data unit from copy 0, find that the data unit 200(3) is corrupt (e.g., via the data unit error-detecting code, C), and can obtain a valid copy of the data unit from another copy (e.g., copy 1 of the container "1" in FIG. 2A). Thus, the data corruption detector 124 prevents irreparable data loss that can otherwise be experienced in the context of data movement. Even in storage systems with built in redundancy, moving a container 116 with corrupt data involves writing multiple copies (e.g. in parity or mirror) of the corrupt container, thereby propagating the corrupt data to all available copies of the container, with no way of repairing the corrupt data or otherwise recovering the valid data. By using the data corruption detector 124, such irreparable data loss is prevented.

Alternatively, upon detecting a mismatch between the compared container error-detecting codes 118 for $E_{C1}$, the file system 110 can utilize a repair module 126 to repair the corrupt data within the container "1", as shown by the diagram in FIG. 2A. In some configurations, the repair module 126 can read a different copy of the container "1", such as copy 1, and can utilize the data corruption detector 124 to re-compute the set of container error-detecting codes 118 from copy 1 of the container "1", compare the re-computed container error-detecting codes 118 to the stored container error-detecting codes 118 for $E_{C1}$ in the container metadata 114, and if the compared container error-detecting codes 118 match, which indicates that the data in copy 1 of the container "1" is valid, the repair module 126 moves the container "1" to the new storage location occupied by the container 100 within copy 1 of the volume 112. In some configurations, prior to repairing the corrupt data within the container "1" using an additional copy, the repair module 126 can confirm that multiple available copies of the container "1" are in sync. If any of the available copies are out of sync with other copies of the container "1", the repair module 126 can sync the copies in the storage replication system. Syncing copies can involve verifying the validity of data in each copy and writing valid copies over copies that are determined to be invalid.

When container "1" is moved to the new storage location, the new storage location can have a physical range starting at 5 gigabytes (GB), for example, such that the movement of the container "1" to the new storage location involves updating the start of the physical range for container "1" to the new location of 5 GB, but otherwise leaving the containerized range for container "1" unchanged. Although this describes one class of data movement (a basic container rotation procedure) where a container 116 is moved to a new storage location without changing the size of the container 116, other classes of data movement are possible. For example, moving the container "1" can involve compressing container "1" (i.e., shortening the length of the container "1") and embedding the container "1" within a larger parent container. Container "1" can also be encrypted upon movement of the container. Container "1" could also be compacted upon movement of the container by truncating the container 116 to a size that corresponds to the used portion of the container 116. A compaction operation may be performed where the container 116 is pushed into a parent container of a larger size than the container 116, and any unused portion of the parent container after the container 116 is pushed into the parent container is removed (i.e., the parent container is compacted). In general, for a container 116, such as container "1" of FIG. 2A, to be moved, the target (or destination) storage location is to be free and available for storing data at the target location, the available storage space at the target location is to be of a size that is equal to or greater than the size of the container 116 being moved, and the container 116 involved in the move operation is to be capable of being moved (some data is immovable, such as the container metadata 114).

When container "1" is written to the new storage location, the write is propagated to all copies in a redundant storage system, as shown in FIG. 2A by the propagation arrow from copy 1 to copy 0. Accordingly, upon writing container "1" to the new storage location, the repair module 126 also writes/propagates the container "1" to a corresponding storage location within copy 0 to ensure that copies 0 and 1 are in sync. Since the original storage location of the container "1" in copy 0 is freed of the corrupt version of container "1", the repair process shown in FIG. 2A restores the valid data for container "1" within copy 0. FIG. 2B shows the resulting configuration after swapping container "1" with container "100". In FIG. 2B, both copies 0 and 1 are repaired, and the data unit 200(3) is no longer corrupt in copy 0.

In some configurations, the data corruption detector 124 can identify one or more corrupt data units 200 within a container 116, such as the corrupt data unit 200(3) in FIG. 2A. As noted above, when N container error-detecting codes 118, $E_C$, are stored for a given container 116, the data corruption detector 124 can use the set of container error-detecting codes 118 to identify up to N-1 corrupt data units 200 within the container 116. Thus, instead of reading the entire container 116 from a valid copy of the container 116 and using the valid copy of the container 116 to repair the corrupt copy of the container, a corrupt data unit 200(3) can be pinpointed within the container 116 using the set of container error-detecting codes 118, $E_C$, and a valid copy of the data unit 200(3) can be read from a valid copy of the container 116 and used to repair the corrupt copy of the data unit 200(3).

Figure 3:
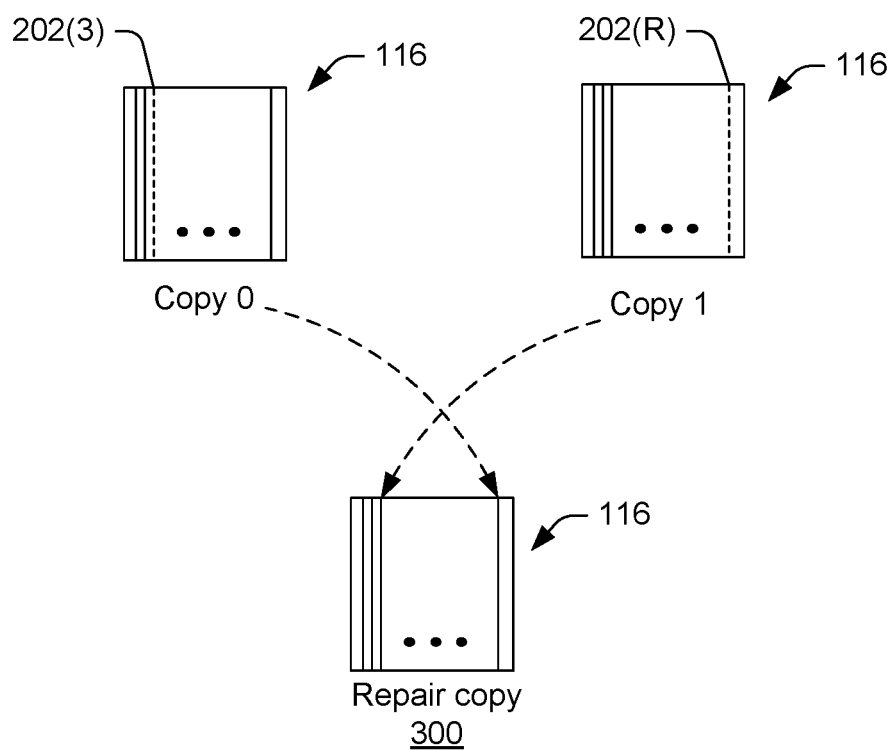
FIG. 3 is a diagram illustrating a repair technique to restore the valid data in a container.

FIG. 3 is a diagram illustrating an example repair technique to restore valid data for a corrupt container 116. In FIG. 3, copy 0 of a container 116 is shown as including valid data units 200 except for one corrupt data unit 200(3), while copy 1 of the container 116 is shown as including valid data units 200 except for one corrupt data unit 200(R) at a different location within the container 116 than the data unit 200(3). In this scenario, if a container-level repair process were to be carried out (as illustrated in FIG. 2A), copy 1 of the container 116 would not be deemed suitable for repairing copy 0 of the container 116 because upon re-computing the set of container error-detecting codes 118, $E_C$, for copy 1 of the container 116 and comparing the re-computed container error-detecting codes 118 to the stored container error-detecting codes 118 for the container 116, the data corruption detector 124 would notice a mismatch between the compared container error-detecting codes 118, deeming copy 1 corrupt. However, as noted above, the set of container error-detecting codes 118, $E_C$, for the container 116 can be used to pinpoint the corrupt data unit 200(3) in copy 0 of the container 116, as well as the corrupt data unit 200(R) in copy 1 of the container 116. Once these corrupt data units 200 are identified within the respective copies of the container 116, the repair module 126 can repair the container 116 by reading the data unit 200(3) from copy 1 and writing the valid data unit 200(3) to a repair copy 300. Similarly, the repair module 126 can read the data unit 200(R) from copy 0 and write the valid data unit 200(R) to the repair copy 300 of the container 116. The resulting repair copy 300 of the container 116 is thereafter repaired of the corrupt data units 200(3) and 200(R), and the repair process involved reading individual data units 200 from available copies of the container 116 without reading the entire container 116 to repair corrupt data, which reduces computational cost of the repair process.

In a scenario where all copies of a container 116 have at least N corrupt data units 200, where N is the number of container error-detecting codes 118 in the set of container error-detecting codes 118, such as $E_{C1}$, the set of container error-detecting codes 118, $E_{C1}$, cannot identify the exact data units 200 within the container 116 that are corrupt, yet the data corruption detector 124 can still detect that the container 116 includes corrupt data using the set of container error-detecting codes 118, $E_{C1}$. In this scenario, the repair module 126 can attempt to repair the container 116 by replacing individual data units 200 in the corrupt copy of the container 116 from data units 200 retrieved from additional copies of the container 116, re-computing the set of container error-detecting codes 118 for the container 116 with the new data unit 200 in place of the corrupt data unit 200, and comparing the re-computed container error-detecting codes 118 to the stored container error-detecting codes 118, $E_{C1}$, for the container 116 to determine if the replaced data unit 200 successfully repaired the corrupt data unit 200 in the container 116. The repair module 126 can recursively replace individual data units 200 and check for a successful match when comparing container error-detecting codes 118 for every possible permutation of data unit 200 replacements from additional copies of the container 116, and can execute this repair process until all of the possible permutations are exhausted. If the container 116 cannot be repaired, the container 116 can be marked as immovable in order to prevent propagation of the corrupt data.

The processes described herein are illustrated as a collection of blocks in a logical flow graph, which represents a sequence of operations that can be implemented in hardware, software, or a combination thereof. In the context of software, the blocks represent computer-executable instructions that, when executed by one or more processors, perform the recited operations. Generally, computer-executable instructions include routines, programs, objects, components, data structures, and the like that perform particular functions or implement particular abstract data types. The order in which the operations are described is not intended to be construed as a limitation, and any number of the described blocks can be combined in any order and/or in parallel to implement the processes.

Figure 4:
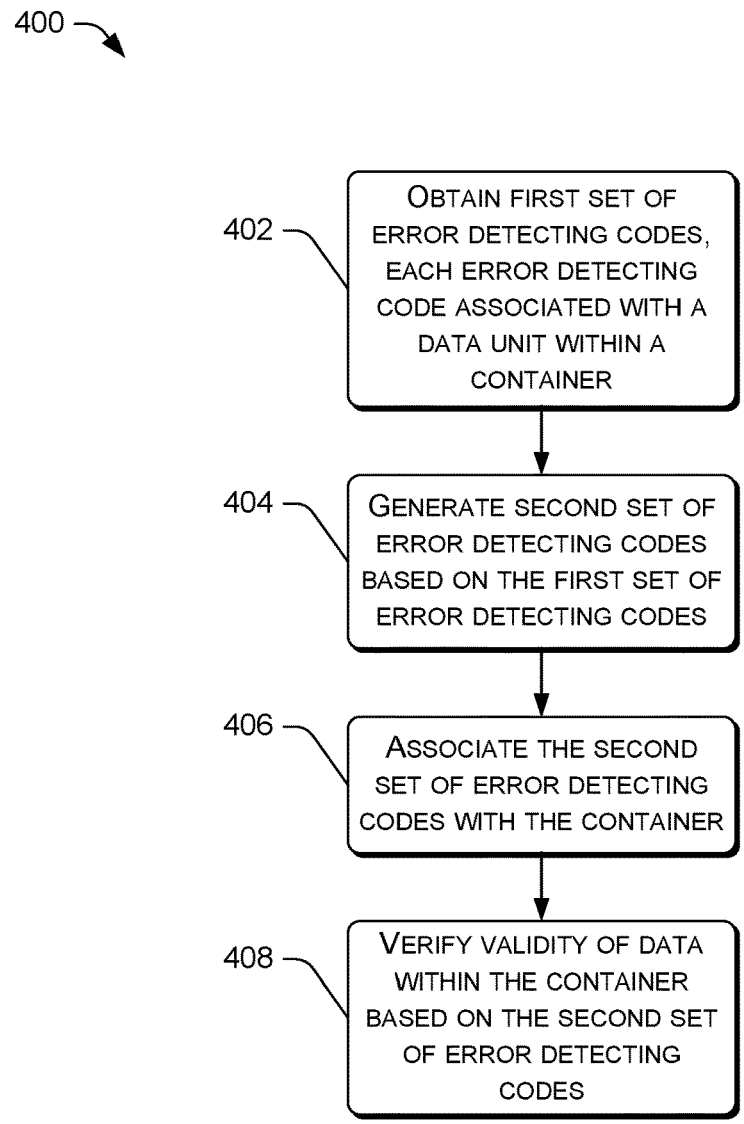
FIG. 4 is a flow diagram of an illustrative process for efficiently verifying validity of data within a container.

FIG. 4 is a flow diagram of an illustrative process 400 for efficiently verifying validity of data within a container 116. For discussion purposes, the process 400 is described with reference to the computer system 100 of FIG. 1, and the diagrams of FIGS. 2A-3.

At 402, the error-detecting code generator 120 can obtain a first set of error-detecting codes from a subset of data stored in a storage system, each error-detecting code, C, in the first set of error-detecting codes being associated with a corresponding data unit 200 within a container 116 of data units 200. In some configurations, the subset of data can comprise a data unit of a file system object, such as file metadata.

At 404, the error-detecting code generator 120 can generate a second set of error-detecting codes 118 based at least in part on the first set of error-detecting codes, and at 406, the error-detecting code generator 120 can associate the second set of error-detecting codes with the container 116, such as by storing the second set of error-detecting codes in the container metadata 114 in association with the container 116. In some configurations, the second set of error-detecting codes 118 is generated as a function of the first set of error-detecting codes. In some configurations, an encoding scheme can be utilized to derive the second set of container error-detecting codes 118 at 404 as described herein.

At 408, the data corruption detector 124 can verify validity of data within the container 116 based at least in part on the second set of error-detecting codes generated at 404 and associated with the container 116 at 406. In some configurations, verification at 408 can comprise reading a copy of the container 116, re-computing container error-detecting codes 118 from the copy of the container 116 to obtain re-computed container error-detecting codes 118, and comparing the re-computed container error-detecting codes 118 to the second set of error-detecting codes generated at 404 and associated with the container 116 at 406. If there is a match between the re-computed container error-detecting codes 118 and the second set of error-detecting codes 118 associated with the container 118, the data within the container 116 is deemed valid. If there is a mismatch between the compared error-detecting codes 118, the data in the container 116 is deemed corrupt/invalid. Furthermore, the process 400 can be performed in the context of moving the container 116 to a new storage location, such that, upon verifying the validity of the container 116 at 408, the container can be moved to a new storage location. In some configurations, one or more operations of the process 400 can be performed by hardware logic components, such as FPGAs, ASICs, SOCs, CPLDs, and the like.

Figure 5:
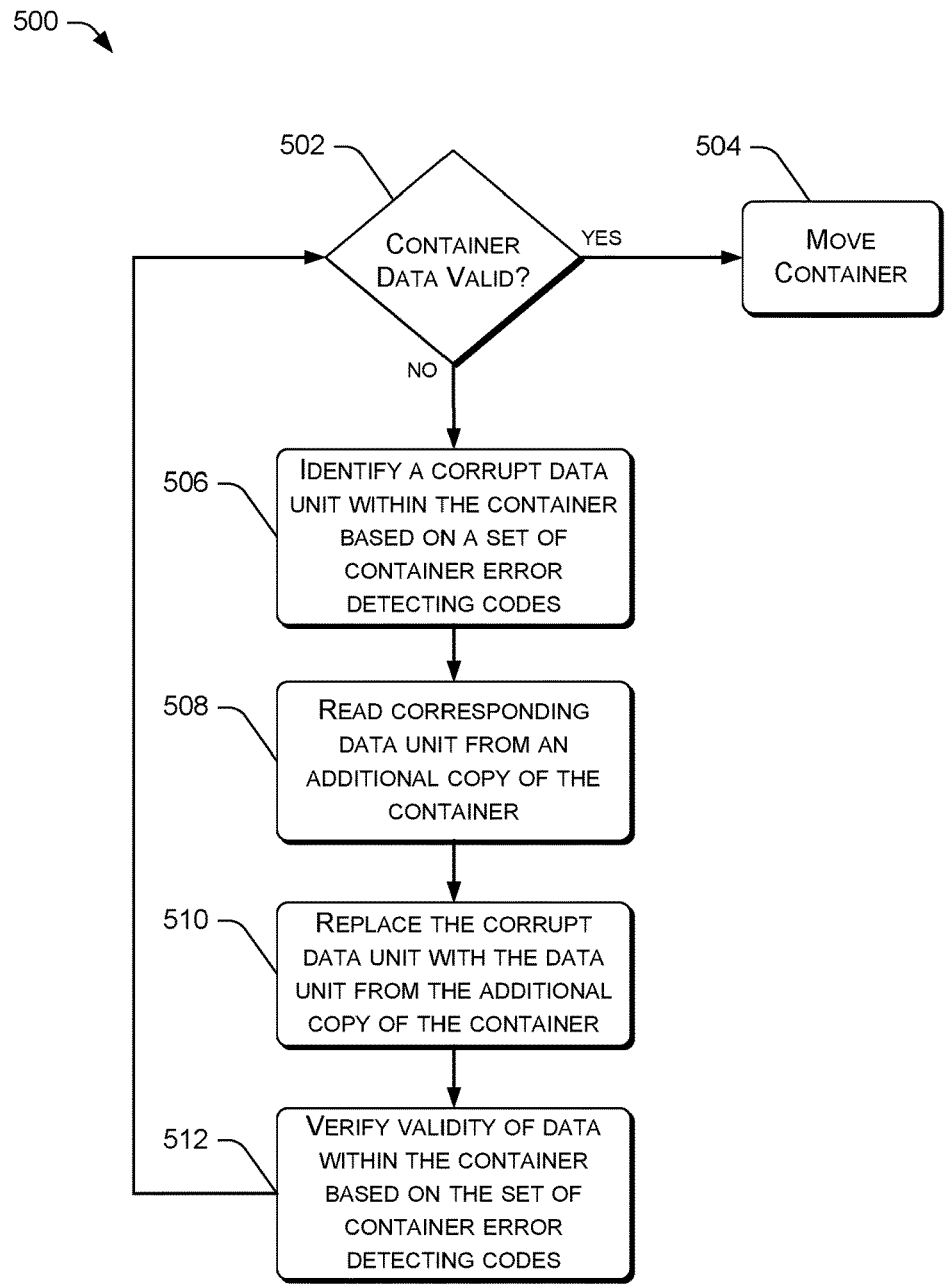
FIG. 5 is a flow diagram of an illustrative process for efficiently restoring valid data within a container.

FIG. 5 is a flow diagram of an illustrative process 500 for efficiently restoring valid data within a container 116. For discussion purposes, the process 500 is described with reference to the computer system 100 of FIG. 1, and the diagrams of FIGS. 2A-3.

At 502, a determination can be made as to whether data within a container 116 is valid or corrupt. For example, the data corruption detector 124 can read a copy of the container 116, re-compute the container error-detecting codes 118 for the container 116 based on the copy of the container 116 to obtain re-computed container error-detecting codes 118, and compare the re-computed container error-detecting codes 118 to stored set of container error-detecting codes 118 in the container metadata 114. If the data in the container 116 is determined to be valid at 502 (e.g., if there is a match between the re-computed container error-detecting codes 118 and the stored set of container error-detecting codes 118), the process 500 can proceed down the "yes" route to 504 where the container is moved to a new storage location. If the data in the container 116 is determined to be corrupt at 502 (e.g., if there is a mismatch between the compared error-detecting codes 118), the process 500 can proceed down the "no" route to 506 where the repair module 126 can identify a corrupt data unit 200 within the container 116 based at least in part on the stored set of container error-detecting codes 118.

At 508, the repair module 126 can read a data unit 200 from an additional copy of the container 116 (e.g., a mirror copy) that corresponds to the corrupt data unit 200 identified at 506.

At 510, the repair module 126 can replace the corrupt data unit 200 with the data unit 200 from the additional copy of the container 116.

At 512, the data corruption detector 124 can verify validity of data within the container 116 after the replacement at 510 based at least in part on the stored set of container error-detecting codes 118 for the container 116. The process 500 provides a computationally cheap method of repairing a corrupt container 116 without reading an entire container 116 from an additional copy. Instead the corrupt data unit 200 is isolated and repaired with a valid data unit 200 from a copy of the container 116. In some configurations, one or more operations of the process 500 can be performed by hardware logic components, such as FPGAs, ASICs, SOCs, CPLDs, and the like.

Example One

A method comprising: obtaining a first set of error-detecting codes (e.g., a set of check values, such as check-sums, cyclic redundancy check (CRC) values, etc.) from a subset of data (e.g., a data unit of a file system object, such as a file, file metadata, etc.) stored in a storage system, each error-detecting code in the first set of error-detecting codes being associated with a corresponding data unit (e.g., a 4 kilobyte (kB) block of data) within a storage region (e.g., a 64 megabyte (MB) container) of data units; generating a second set of error-detecting codes based at least in part on the first set of error-detecting codes; associating the second set of error-detecting codes with the storage region; and verifying validity of data within the storage region based at least in part on the second set of error-detecting codes. The verifying the validity can be performed in response to an instruction to verify the validity (or an instruction to check for corrupt data) that is issued automatically from the file system, or from a user command (e.g., a command from an administrator, or authorized user, of the file system). An instruction to verify the validity of data within the storage region can be provided in response to an instruction to move the storage region to a new storage location. This movement instruction can be system-generated or user-generated.

Example Two

The method of Example One, wherein verifying the validity of the data within the storage region comprises: reading a copy (e.g., one of multiple copies of the same data provided as part of a mirror configuration, a parity configuration, or the like, that provides redundancy for the stored data within the storage system) of the storage region; re-computing error-detecting codes for the storage region from the copy of the storage region to obtain re-computed error-detecting codes; and comparing the re-computed error-detecting codes to the second set of error-detecting codes to determine whether there is a match between the re-computed error-detecting codes and the second set of error-detecting codes.

Example Three

The method of any of the previous examples, alone or in combination, wherein generating the second set of error-detecting codes comprises encoding the first set of error-detecting codes by applying a mathematical function (e.g., a series of exclusive or (XOR, ⊕) operations applied to polynomial functions that characterize the individual error-detecting codes in the second set of error-detecting codes) to the first set of error-detecting codes.

Example Four

The method of any of the previous examples, alone or in combination, wherein encoding the first set of error-detecting codes is performed using Reed Solomon encoding.

Example Five

The method of any of the previous examples, alone or in combination, wherein the second set of error-detecting codes: are fewer in number than a number of the first set of error-detecting codes (e.g., compressing the amount of data for storing the first set of error-detecting codes to a smaller amount of data for storing the second set of error-detecting codes); and retain characteristics of the first set of error-detecting codes for detecting corruptions in data.

Example Six

The method of any of the previous examples, alone or in combination, wherein associating the second set of error-detecting codes with the storage region comprises storing the second set of error-detecting codes in metadata associated with the storage region.

Example Seven

The method of any of the previous examples, alone or in combination, further comprising, prior to verifying the validity of the data within the storage region, retrieving the second set of error-detecting codes from the metadata associated with the storage region.

Example Eight

The method of any of the previous examples, alone or in combination, further comprising: determining that the data within the storage region is valid based at least in part on verifying the validity of the data within the storage region; and in response to determining that the data within the storage region is valid, moving the storage region from a current storage location to a new storage location (e.g., performing a container rotation procedure).

Example Nine

The method of any of the previous examples, alone or in combination, further comprising: determining that at least a portion of the data within a copy of the storage region is corrupt based at least in part on verifying the validity of the data within the copy of the storage region; and in response to determining that at least the portion of the data within the copy of the storage region is corrupt, repairing corrupt data within the copy of the storage region.

Example Ten

The method of any of the previous examples, alone or in combination, wherein repairing the corrupt data comprises: selecting an additional copy of the storage region; reading the additional copy of the storage region; determining that data within the additional copy of the storage region is valid based at least in part on the second set of error-detecting codes (e.g., re-computing the second set of error-detecting codes, comparing the re-computed second set of error-detecting codes to the previously generated second set of error-detecting codes associated with the storage region, and determining that the compared error-detecting codes match); and repairing the corrupt data using the data within the additional copy of the storage region (e.g., overwriting the corrupt copy of the storage region with data from the valid, additional copy of the storage region).

Example Eleven

The method of any of the previous examples, alone or in combination, wherein repairing the corrupt data further comprises: writing the additional copy of the storage region to a storage location that is different from a current storage location of the copy of the storage region (e.g., carrying out a movement operation for the storage region by moving the valid, additional the storage region to the target/destination storage location); and propagating the additional copy of the storage region to other copies of the storage region in the storage system.

Example Twelve

The method of any of the previous examples, alone or in combination, wherein repairing the corrupt data comprises: identifying a corrupt data unit within the copy of storage region based at least in part on the second set of error-detecting codes; reading a data unit from an additional copy of the storage region that corresponds to the corrupt data unit; replacing the corrupt data unit with the data unit from the additional copy of the storage region to convert the copy of the storage region to a new copy of the storage region; and determining that the data within the new copy of the storage region is valid based at least in part on the second set of error-detecting codes (e.g., re-computing the second set of error-detecting codes, comparing the re-computed second set of error-detecting codes to the previously generated second set of error-detecting codes associated with the storage region, and determining that the compared error-detecting codes match).

Example Thirteen

The method of any of the previous examples, alone or in combination, further comprising: receiving an indication that a data unit has changed within the storage region; identifying the data unit that has changed; obtaining a previous data unit error-detecting code from the first set of error-detecting codes; computing a new data unit error-detecting code from the subset of the data; and updating a particular error-detecting code of the second set of error-detecting codes based on the previous data unit error-detecting code and the new data unit error-detecting code.

Example Fourteen

The method of any of the previous examples, alone or in combination, wherein generating the second set of error-detecting codes comprises computing a set of parities based on the first set of error-detecting codes.

Example Fifteen

The method of any of the previous examples, alone or in combination, wherein: the subset of the data comprises metadata associated with a file; obtaining the first set of error-detecting codes comprises copying the first set of error-detecting codes from the metadata associated with the file to obtain a copy of the first set of error-detecting codes; and generating the second set of error-detecting codes comprises storing the copy of the first set of error-detecting codes in the metadata associated with the storage region as the second set of error-detecting codes.

Example Sixteen

The method of any of the previous examples, alone or in combination, wherein: the subset of the data comprises a data unit of a file system object; and the storage region is one of a plurality of storage regions within a volume.

Example Seventeen

A system comprising: a processor (e.g., central processing unit (CPU), a field programmable gate array (FPGA), a complex programmable logic device (CPLD), an application specific integrated circuit (ASIC), a system-on-chip (SoC), etc.); and memory (e.g., RAM, ROM, EEPROM, flash memory, etc.) storing a file system configured to manage access to data stored within a storage system, the file system comprising instructions that, when executed by the processor, perform operations comprising: obtaining a first set of error-detecting codes (e.g., a set of check values, such as checksums, cyclic redundancy check (CRC) values, etc.) from a subset of the data (e.g., a data unit of a file system object, such as a file, file metadata, etc.) stored in the storage system, each error-detecting code in the first set of error-detecting codes being associated with a corresponding data unit (e.g., a 4 kilobyte (kB) block of data) within a storage region (e.g., a 64 megabyte (MB) container) of data units; generating a second set of error-detecting codes based at least in part on the first set of error-detecting codes; associating the second set of error-detecting codes with the storage region; and verifying validity of data within the storage region based at least in part on the second set of error-detecting codes. The verifying the validity can be performed in response to an instruction to verify the validity (or an instruction to check for corrupt data) that is issued automatically from the file system, or from a user command (e.g., a command from an administrator, or authorized user, of the file system). An instruction to verify the validity of data within the storage region can be provided in response to an instruction to move the storage region to a new storage location. This movement instruction can be system-generated or user-generated.

Example Eighteen

The system of Example Seventeen, wherein verifying the validity of the data within the storage region comprises: reading a copy (e.g., one of multiple copies of the same data provided as part of a mirror configuration, a parity configuration, or the like, that provides redundancy for the stored data within the storage system) of the storage region; re-computing error-detecting codes for the storage region from the copy of the storage region to obtain re-computed error-detecting codes; and comparing the re-computed error-detecting codes to the second set of error-detecting codes to determine whether there is a match between the re-computed error-detecting codes and the second set of error-detecting codes.

Example Nineteen

The system of any of the previous examples, alone or in combination, wherein generating the second set of error-detecting codes comprises encoding the first set of error-detecting codes by applying a mathematical function (e.g., a series of exclusive or (XOR, ⊕) operations applied to polynomial functions that characterize the individual error-detecting codes in the second set of error-detecting codes) to the first set of error-detecting codes.

Example Twenty

The system of any of the previous examples, alone or in combination, wherein encoding the first set of error-detecting codes is performed using Reed Solomon encoding.

Example Twenty-One

The system of any of the previous examples, alone or in combination, wherein the second set of error-detecting codes: are fewer in number than a number of the first set of error-detecting codes (e.g., compressing the amount of data for storing the first set of error-detecting codes to a smaller amount of data for storing the second set of error-detecting codes); and retain characteristics of the first set of error-detecting codes for detecting corruptions in data.

Example Twenty-Two

The system of any of the previous examples, alone or in combination, wherein associating the second set of error-detecting codes with the storage region comprises storing the second set of error-detecting codes in metadata associated with the storage region.

Example Twenty-Three

The system of any of the previous examples, alone or in combination, the operations further comprising, prior to verifying the validity of the data within the storage region, retrieving the second set of error-detecting codes from the metadata associated with the storage region.

Example Twenty-Four

The system of any of the previous examples, alone or in combination, the operations further comprising: determining that the data within the storage region is valid based at least in part on verifying the validity of the data within the storage region; and in response to determining that the data within the storage region is valid, moving the storage region from a current storage location to a new storage location (e.g., performing a container rotation procedure).

Example Twenty-Five

The system of any of the previous examples, alone or in combination, the operations further comprising: determining that at least a portion of the data within a copy of the storage region is corrupt based at least in part on verifying the validity of the data within the copy of the storage region; and in response to determining that at least the portion of the data within the copy of the storage region is corrupt, repairing corrupt data within the copy of the storage region.

Example Twenty-Six

The system of any of the previous examples, alone or in combination, wherein repairing the corrupt data comprises: selecting an additional copy of the storage region; reading the additional copy of the storage region; determining that data within the additional copy of the storage region is valid based at least in part on the second set of error-detecting codes (e.g., re-computing the second set of error-detecting codes, comparing the re-computed second set of error-detecting codes to the previously generated second set of error-detecting codes associated with the storage region, and determining that the compared error-detecting codes match); and repairing the corrupt data using the data within the additional copy of the storage region (e.g., overwriting the corrupt copy of the storage region with data from the valid, additional copy of the storage region).

Example Twenty-Seven

The system of any of the previous examples, alone or in combination, wherein repairing the corrupt data further comprises: writing the additional copy of the storage region to a storage location that is different from a current storage location of the copy of the storage region (e.g., carrying out a movement operation for the storage region by moving the valid, additional the storage region to the target/destination storage location); and propagating the additional copy of the storage region to other copies of the storage region in the storage system.

Example Twenty-Eight

The system of any of the previous examples, alone or in combination, wherein repairing the corrupt data comprises: identifying a corrupt data unit within the copy of storage region based at least in part on the second set of error-detecting codes; reading a data unit from an additional copy of the storage region that corresponds to the corrupt data unit; replacing the corrupt data unit with the data unit from the additional copy of the storage region to convert the copy of the storage region to a new copy of the storage region; and determining that the data within the new copy of the storage region is valid based at least in part on the second set of error-detecting codes (e.g., re-computing the second set of error-detecting codes, comparing the re-computed second set of error-detecting codes to the previously generated second set of error-detecting codes associated with the storage region, and determining that the compared error-detecting codes match).

Example Twenty-Nine

The system of any of the previous examples, alone or in combination, the operations further comprising: receiving an indication that a data unit has changed within the storage region; identifying the data unit that has changed; obtaining a previous data unit error-detecting code from the first set of error-detecting codes; computing a new data unit error-detecting code from the subset of the data; and updating a particular error-detecting code of the second set of error-detecting codes based on the previous data unit error-detecting code and the new data unit error-detecting code.

Example Thirty

The system of any of the previous examples, alone or in combination, wherein generating the second set of error-detecting codes comprises computing a set of parities based on the first set of error-detecting codes.

Example Thirty-One

The system of any of the previous examples, alone or in combination, wherein: the subset of the data comprises metadata associated with a file; obtaining the first set of error-detecting codes comprises copying the first set of error-detecting codes from the metadata associated with the file to obtain a copy of the first set of error-detecting codes; and generating the second set of error-detecting codes comprises storing the copy of the first set of error-detecting codes in the metadata associated with the storage region as the second set of error-detecting codes.

Example Thirty-Two

The system of any of the previous examples, alone or in combination, wherein: the subset of the data comprises a data unit of a file system object; and the storage region is one of a plurality of storage regions within a volume.

Example Thirty-Three

One or more computer-readable storage media (e.g., RAM, ROM, EEPROM, flash memory, etc.) storing computer-executable instructions that, when executed by a processor (e.g., central processing unit (CPU), a field programmable gate array (FPGA), a complex programmable logic device (CPLD), an application specific integrated circuit (ASIC), a system-on-chip (SoC), etc.), perform operations comprising: obtaining a first set of error-detecting codes (e.g., a set of check values, such as checksums, cyclic redundancy check (CRC) values, etc.) from a subset of data (e.g., a data unit of a file system object, such as a file, file metadata, etc.) stored in a storage system, each error-detecting code in the first set of error-detecting codes being associated with a corresponding data unit (e.g., a 4 kilobyte (kB) block of data) within a storage region (e.g., a 64 megabyte (MB) container) of data units; generating a second set of error-detecting codes based at least in part on the first set of error-detecting codes; associating the second set of error-detecting codes with the storage region; and verifying validity of data within the storage region based at least in part on the second set of error-detecting codes. The verifying the validity can be performed in response to an instruction to verify the validity (or an instruction to check for corrupt data) that is issued automatically from the file system, or from a user command (e.g., a command from an administrator, or authorized user, of the file system). An instruction to verify the validity of data within the storage region can be provided in response to an instruction to move the storage region to a new storage location. This movement instruction can be system-generated or user-generated.

Example Thirty-Four

The one or more computer-readable storage media of Example Thirty-Three, wherein verifying the validity of the data within the storage region comprises: reading a copy (e.g., one of multiple copies of the same data provided as part of a mirror configuration, a parity configuration, or the like, that provides redundancy for the stored data within the storage system) of the storage region; re-computing error-detecting codes for the storage region from the copy of the storage region to obtain re-computed error-detecting codes; and comparing the re-computed error-detecting codes to the second set of error-detecting codes to determine whether there is a match between the re-computed error-detecting codes and the second set of error-detecting codes.

Example Thirty-Five

The one or more computer-readable storage media of any of the previous examples, alone or in combination, wherein generating the second set of error-detecting codes comprises encoding the first set of error-detecting codes by applying a mathematical function (e.g., a series of exclusive or (XOR, ⊕) operations applied to polynomial functions that characterize the individual error-detecting codes in the second set of error-detecting codes) to the first set of error-detecting codes.

Example Thirty-Six

The one or more computer-readable storage media of any of the previous examples, alone or in combination, wherein encoding the first set of error-detecting codes is performed using Reed Solomon encoding.

Example Thirty-Seven

The one or more computer-readable storage media of any of the previous examples, alone or in combination, wherein the second set of error-detecting codes: are fewer in number than a number of the first set of error-detecting codes (e.g., compressing the amount of data for storing the first set of error-detecting codes to a smaller amount of data for storing the second set of error-detecting codes); and retain characteristics of the first set of error-detecting codes for detecting corruptions in data.

Example Thirty-Eight

The one or more computer-readable storage media of any of the previous examples, alone or in combination, wherein associating the second set of error-detecting codes with the storage region comprises storing the second set of error-detecting codes in metadata associated with the storage region.

Example Thirty-Nine

The one or more computer-readable storage media of any of the previous examples, alone or in combination, the operations further comprising, prior to verifying the validity of the data within the storage region, retrieving the second set of error-detecting codes from the metadata associated with the storage region.

Example Forty

The one or more computer-readable storage media of any of the previous examples, alone or in combination, the operations further comprising: determining that the data within the storage region is valid based at least in part on verifying the validity of the data within the storage region; and in response to determining that the data within the storage region is valid, moving the storage region from a current storage location to a new storage location (e.g., performing a container rotation procedure).

Example Forty-One

The one or more computer-readable storage media of any of the previous examples, alone or in combination, the operations further comprising: determining that at least a portion of the data within a copy of the storage region is corrupt based at least in part on verifying the validity of the data within the copy of the storage region; and in response to determining that at least the portion of the data within the copy of the storage region is corrupt, repairing corrupt data within the copy of the storage region.

Example Forty-Two

The one or more computer-readable storage media of any of the previous examples, alone or in combination, wherein repairing the corrupt data comprises: selecting an additional copy of the storage region; reading the additional copy of the storage region; determining that data within the additional copy of the storage region is valid based at least in part on the second set of error-detecting codes (e.g., re-computing the second set of error-detecting codes, comparing the re-computed second set of error-detecting codes to the previously generated second set of error-detecting codes associated with the storage region, and determining that the compared error-detecting codes match); and repairing the corrupt data using the data within the additional copy of the storage region (e.g., overwriting the corrupt copy of the storage region with data from the valid, additional copy of the storage region).

Example Forty-Three

The one or more computer-readable storage media of any of the previous examples, alone or in combination, wherein repairing the corrupt data further comprises: writing the additional copy of the storage region to a storage location that is different from a current storage location of the copy of the storage region (e.g., carrying out a movement operation for the storage region by moving the valid, additional the storage region to the target/destination storage location); and propagating the additional copy of the storage region to other copies of the storage region in the storage system.

Example Forty-Four

The one or more computer-readable storage media of any of the previous examples, alone or in combination, wherein repairing the corrupt data comprises: identifying a corrupt data unit within the copy of storage region based at least in part on the second set of error-detecting codes; reading a data unit from an additional copy of the storage region that corresponds to the corrupt data unit; replacing the corrupt data unit with the data unit from the additional copy of the storage region to convert the copy of the storage region to a new copy of the storage region; and determining that the data within the new copy of the storage region is valid based at least in part on the second set of error-detecting codes (e.g., re-computing the second set of error-detecting codes, comparing the re-computed second set of error-detecting codes to the previously generated second set of error-detecting codes associated with the storage region, and determining that the compared error-detecting codes match).

Example Forty-Five

The one or more computer-readable storage media of any of the previous examples, alone or in combination, the operations further comprising: receiving an indication that a data unit has changed within the storage region; identifying the data unit that has changed; obtaining a previous data unit error-detecting code from the first set of error-detecting codes; computing a new data unit error-detecting code from the subset of the data; and updating a particular error-detecting code of the second set of error-detecting codes based on the previous data unit error-detecting code and the new data unit error-detecting code.

Example Forty-Six

The one or more computer-readable storage media of any of the previous examples, alone or in combination, wherein generating the second set of error-detecting codes comprises computing a set of parities based on the first set of error-detecting codes.

Example Forty-Seven

The one or more computer-readable storage media of any of the previous examples, alone or in combination, wherein: the subset of the data comprises metadata associated with a file; obtaining the first set of error-detecting codes comprises copying the first set of error-detecting codes from the metadata associated with the file to obtain a copy of the first set of error-detecting codes; and generating the second set of error-detecting codes comprises storing the copy of the first set of error-detecting codes in the metadata associated with the storage region as the second set of error-detecting codes.

Example Forty-Eight

The one or more computer-readable storage media of any of the previous examples, alone or in combination, wherein: the subset of the data comprises a data unit of a file system object; and the storage region is one of a plurality of storage regions within a volume.

Example Forty-Nine

A method comprising: obtaining a first set of error-detecting codes from a data unit of a file system object stored in a storage system, each error-detecting code in the first set of error-detecting codes being associated with a corresponding data unit within a storage region of data units in a volume; generating a second set of error-detecting codes based at least in part on the first set of error-detecting codes; associating the second set of error-detecting codes with the storage region; and verifying validity of data within the storage region based at least in part on the second set of error-detecting codes.

Example Fifty

A method comprising: obtaining a first set of error-detecting codes from a subset of data stored in a storage system, each error-detecting code in the first set of error-detecting codes being associated with a corresponding data unit within a storage region of data units; generating a second set of error-detecting codes based at least in part on the first set of error-detecting codes; storing the second set of error-detecting codes in metadata associated with the storage region; retrieving the second set of error-detecting from the metadata associated with the storage region; and verifying validity of data within the storage region based at least in part on the second set of error-detecting codes retrieved from the metadata associated with the storage region.

Example Fifty-One

A system comprising: means for executing computer-executable instructions (e.g., central processing unit (CPU), a field programmable gate array (FPGA), a complex programmable logic device (CPLD), an application specific integrated circuit (ASIC), a system-on-chip (SoC), etc.); and means for storing (e.g., RAM, ROM, EEPROM, flash memory, etc.) a file system configured to manage access to data stored within a means for storing data, the file system comprising instructions that, when executed by the means for executing computer-executable instructions, perform operations comprising: obtaining a first set of error-detecting codes (e.g., a set of check values, such as checksums, cyclic redundancy check (CRC) values, etc.) from a subset of the data (e.g., a data unit of a file system object, such as a file, file metadata, etc.) stored in the means for storing data, each error-detecting code in the first set of error-detecting codes being associated with a corresponding data unit (e.g., a 4 kilobyte (kB) block of data) within a storage region (e.g., a 64 megabyte (MB) container) of data units; generating a second set of error-detecting codes based at least in part on the first set of error-detecting codes; associating the second set of error-detecting codes with the storage region; and verifying validity of data within the storage region based at least in part on the second set of error-detecting codes. The verifying the validity can be performed in response to an instruction to verify the validity (or an instruction to check for corrupt data) that is issued automatically from the file system, or from a user command (e.g., a command from an administrator, or authorized user, of the file system). An instruction to verify the validity of data within the storage region can be provided in response to an instruction to move the storage region to a new storage location. This movement instruction can be system-generated or user-generated.

The environment and individual elements described herein can of course include many other logical, programmatic, and physical components, of which those shown in the accompanying figures are merely examples that are related to the discussion herein.

Other architectures can be used to implement the described functionality, and are intended to be within the scope of this disclosure. Furthermore, although specific distributions of responsibilities are defined above for purposes of discussion, the various functions and responsibilities might be distributed and divided in different ways, depending on circumstances.

CONCLUSION

In closing, although the various configurations have been described in language specific to structural features and/or methodological acts, it is to be understood that the subject matter defined in the appended representations is not necessarily limited to the specific features or acts described. Rather, the specific features and acts are disclosed as example forms of implementing the claimed subject matter.

What is claimed is:
1. A method comprising:
   obtaining a first set of error-detecting codes associated with a set of data units stored in a container of a storage system, wherein the first set of error-detecting codes are stored in file-level metadata in the storage system;
   encoding the first set of error-detecting codes to generate a second set of error-detecting codes by applying a mathematical function to the first set of error-detecting codes, wherein the second set of error-detecting codes are container-level error-detecting codes;
   storing the second set of error-detecting codes in container-level metadata associated with the container, wherein the container-level metadata is stored separately in the storage system from the file-level metadata; and
   accessing the container-level metadata associated with the container to determine, based at least in part on the second set of error-detecting codes, whether at least a portion of the set of data units stored within the container is corrupt.
2. The method of claim 1, further comprising determining that the portion of the set of data units stored within the container is not corrupt by:
   selecting an additional copy of the container;
   reading the additional copy of the container;
   re-computing error-detecting codes for the container from the additional copy of the container to obtain re-computed error-detecting codes; and
   comparing the re-computed error-detecting codes to the second set of error-detecting codes to determine whether there is a match between the re-computed error-detecting codes and the second set of error-detecting codes.

3. The method of claim 1, wherein encoding the first set of error-detecting codes is performed using Reed Solomon encoding.

4. The method of claim 1, wherein the second set of error-detecting codes:
are fewer in number than a number of the first set of error-detecting codes; and
retain characteristics of the first set of error-detecting codes for detecting corruptions in data.

5. The method of claim 1, further comprising moving the container from a current storage location to a new storage location based on a determination that the portion of the set of data units stored within the container is not corrupt.

6. The method of claim 1, further comprising:
based on a determination that the portion of the set of data units stored within the container is corrupt, selecting an additional copy of the container;
reading the additional copy of the container;
determining that data within the additional copy of the container is valid based at least in part on the second set of error-detecting codes; and
repairing the portion of the set of data units stored within the container that is corrupt using the data within the additional copy of the container by:
writing the additional copy of the container to a storage location that is different from a current storage location of the container; and
propagating the additional copy of the container to other copies of the container in the storage system.

7. The method of claim 6, wherein repairing the portion of the set of data units comprises:
identifying a corrupt data unit within the container based at least in part on the second set of error-detecting codes;
reading a data unit from the additional copy of the container that corresponds to the corrupt data unit;
replacing the corrupt data unit with the data unit from the additional copy of the container to convert the container to a new copy of the container; and
determining that data within the new copy of the container is valid based at least in part on the second set of error-detecting codes.

8. A system comprising:
a processor; and
memory storing a file system configured to manage access to data stored within a storage system, the file system comprising instructions that, in response to execution by the processor, perform operations comprising:
obtaining a first set of error-detecting codes associated with a set of data units stored in a container of the storage system, wherein the first set of error-detecting codes are stored in file-level metadata in the storage system;
encoding the first set of error-detecting codes to generate a second set of error-detecting codes by applying a mathematical function to the first set of error-detecting codes, wherein the second set of error-detecting codes are container-level error-detecting codes;
storing the second set of error-detecting codes in container-level metadata associated with the container, wherein the container-level metadata is stored separately in the storage system from the file-level metadata; and
accessing the container-level metadata associated with the container to determine, based at least in part on the second set of error-detecting codes, whether at least a portion of the set of data units stored in the container is corrupt.

9. The system of claim 8, the operations further comprising:
receiving an indication that a data unit has changed within the container;
identifying the data unit that has changed;
obtaining a previous data unit error-detecting code from the first set of error-detecting codes;
computing a new data unit error-detecting code from the set of data units; and
updating a particular error-detecting code of the second set of error-detecting codes based on the previous data unit error-detecting code and the new data unit error-detecting code.

10. A method comprising:
obtaining a first set of error-detecting codes associated with a set of data units stored within a container of a storage system, wherein the first set of error-detecting codes are stored in file-level metadata in the storage system;
generating a second set of error-detecting codes based at least in part on the first set of error-detecting codes, wherein the second set of error-detecting codes are container-level error-detecting codes;
storing the second set of error-detecting codes in container-level metadata associated with the container, wherein the container-level metadata is stored separately in the storage system from the file-level metadata;
retrieving the second set of error-detecting codes from the container-level metadata associated with the container;
determining that at least a portion of the set of data units stored within the container is corrupt based at least in part on the second set of error-detecting codes retrieved from the container-level metadata associated with the container;
in response to determining that the portion of the set of data units stored within the container is corrupt, selecting an additional copy of the container;
reading the additional copy of the container;
determining that data within the additional copy of the container is valid based at least in part on the second set of error-detecting codes; and
repairing the portion of the set of data units stored within the container that is corrupt using the data within the additional copy of the container.

11. The method of claim 10, wherein generating the second set of error-detecting codes comprises encoding the first set of error-detecting codes by applying a mathematical function to the first set of error-detecting codes.

12. The method of claim 10, wherein generating the second set of error-detecting codes comprises computing a set of parities based on the first set of error-detecting codes.

13. The method of claim 10, wherein:
the first set of error-detecting codes are obtained from the file-level metadata associated with a file;
obtaining the first set of error-detecting codes comprises copying the first set of error-detecting codes from the file-level metadata associated with the file to obtain a copy of the first set of error-detecting codes; and
generating the second set of error-detecting codes comprises storing the copy of the first set of error-detecting codes in the container-level metadata associated with the container as the second set of error-detecting codes.

* * * * *